United States Patent
Noh et al.

(10) Patent No.: US 11,463,197 B2
(45) Date of Patent: Oct. 4, 2022

(54) METHOD FOR OPERATING COMMUNICATION DEVICE IN WIRELESS COMMUNICATION SYSTEM, AND COMMUNICATION DEVICE USING SAME

(71) Applicant: LG Electronics Inc., Seoul (KR)

(72) Inventors: Kwangseok Noh, Seoul (KR); Bonghoe Kim, Seoul (KR); Kijun Jeon, Seoul (KR)

(73) Assignee: LG Electronics Inc., Seoul (KR)

( * ) Notice: Subject to any disclaimer, the term of this patent is extended or adjusted under 35 U.S.C. 154(b) by 94 days.

(21) Appl. No.: 16/968,500

(22) PCT Filed: Feb. 20, 2019

(86) PCT No.: PCT/KR2019/002049
§ 371 (c)(1),
(2) Date: Aug. 7, 2020

(87) PCT Pub. No.: WO2019/164249
PCT Pub. Date: Aug. 29, 2019

(65) Prior Publication Data
US 2020/0412481 A1 Dec. 31, 2020

Related U.S. Application Data

(60) Provisional application No. 62/634,197, filed on Feb. 23, 2018.

(51) Int. Cl.
*H04L 1/00* (2006.01)
*H03M 13/09* (2006.01)
(Continued)

(52) U.S. Cl.
CPC .......... *H04L 1/0061* (2013.01); *H03M 13/09* (2013.01); *H03M 13/13* (2013.01); *H04L 1/0011* (2013.01);
(Continued)

(58) Field of Classification Search
None
See application file for complete search history.

(56) References Cited

U.S. PATENT DOCUMENTS

2017/0366199 A1   12/2017   Ge et al.

FOREIGN PATENT DOCUMENTS

WO   WO2017196114   11/2017

OTHER PUBLICATIONS

AT&T, Polar code considerations for search space design, R1-1718395, 3GPP TSG RAN WG1 Meeting 90bis, Prague, CZ, Oct. 9-13, 2017, 2 pages.

(Continued)

*Primary Examiner* — Walter J Divito
(74) *Attorney, Agent, or Firm* — Fish & Richardson P.C.

(57) ABSTRACT

A method for operating a communication device in a wireless communication system, according to the present embodiment, comprises the steps of: determining first information related to an aggregation level for a PDCCH and second information related to a mother code size for a polar code, the aggregation level being related to a first level to a fifth level, the mother code size being related to a first size to a third size, and the second information being determined according to the first information; determining whether the first information is determined to be the third level; and generating a CRC block comprising a masking sequence of a first type, when the first information is considered to be determined to be the third level.

8 Claims, 20 Drawing Sheets

(51) Int. Cl.
*H03M 13/13* (2006.01)
*H04W 72/04* (2009.01)
(52) U.S. Cl.
CPC ......... *H04L 1/0038* (2013.01); *H04W 72/042* (2013.01)

(56) References Cited

OTHER PUBLICATIONS

Huawei, HiSilicon, Blind detection ambiguity for DCI, R1-1802898, 3GPP TSG RAN WG1 Meeting #92, Athens, Greece, Feb. 26-Mar. 2, 2018, 4 pages.
Samsung, Remaining Issues on NR Polar Coding, R1-1801992, 3GPP TSG RAN WG1 Meeting #92, Athenes, Greece, Feb. 26-Mar. 2, 2018, 8 pages.

Capacity (a) N=2

Capacity (b) N=4

Capacity (c) N=$2^{10}$

METHOD FOR OPERATING COMMUNICATION DEVICE IN WIRELESS COMMUNICATION SYSTEM, AND COMMUNICATION DEVICE USING SAME

CROSS-REFERENCE TO RELATED APPLICATIONS

This application is a National Stage application under 35 U.S.C. § 371 of International Application No. PCT/KR2019/002049, filed on Feb. 20, 2019, which claims the benefit of U.S. Provisional Application No. 62/634,197 filed on Feb. 23, 2018. The disclosures of the prior applications are incorporated by reference in their entirety.

BACKGROUNDS

Field of the Description

The description relates to wireless communication and, most particularly, to a method for operating communication device in wireless communication system and communication device using same.

Related Art

As more and more communication devices require more communication capacity, there is a need for improved mobile broadband communication over existing radio access technology. Also, massive machine type communications (MTC), which provides various services by connecting many devices and objects, is one of the major issues to be considered in the next generation communication.

Communication system design considering reliability/latency sensitive service/UE is being discussed. The introduction of next generation radio access technology considering enhanced mobile broadband communication (eMBB), massive MTC (mMTC), ultrareliable and low latency communication (URLLC) is discussed. This new technology may be called new radio access technology (new RAT or NR) in the present description for convenience.

Meanwhile, in the existing long term evolution (LTE), when a size of a transport block is increased to be greater than a specific size, data to be transmitted is divided into several code blocks, and channel coding and cyclic redundancy check (CRC) are added and included in the transport block, and thereafter are transmitted through one data channel.

In NR, since it is considered to use a wider system band than the existing LTE, there is a possibility that a size of one transport block is relatively great. Accordingly, the number of code blocks constituting one transport block may also be increased.

SUMMARY

An object of the present description is to provide a method of operating a communication device in a wireless communication system, and the communication device using the method.

A method of operating a communication device in a wireless communication system according to a present embodiment includes determining first information related to an aggregation level for a physical downlink control channel (PDCCH) and second information related to a mother code size for a polar code, wherein the aggregation level is related to a first level to a fifth level, wherein the mother code size is related to a first size to a third size, and wherein the second information is determined based on the first information, determining whether the first information is determined to the third level, and generating a cyclic redundancy check (CRC) block comprising a masking sequence of a first type upon deciding that the first information is determined to the third level.

According to a present embodiment, in a block decoding procedure for a PDCCH, a mother code size with a correct size can be selected. In addition, since the number of masking sequences related to an aggregation level for the PDCCH can be decreased, an overhead of a wireless communication system can be decreased. Consequently, according to the present description, a wireless communication system with improved performance can be provided.

DESCRIPTION OF EXEMPLARY EMBODIMENTS

The above-described features and the following detailed description are exemplary contents for helping a description and understanding of the present description. That is, the present description is not limited to this embodiment and may be embodied in other forms. The following embodiments are merely examples to fully disclose the present description, and are descriptions to transfer the present description to those skilled in the art. Therefore, when there are several methods for implementing components of the present description, it is necessary to clarify that the present description may be implemented with a specific one of these methods or equivalent thereof.

In the present description, when there is a description in which a configuration includes specific elements, or when there is a description in which a process includes specific steps, it means that other elements or other steps may be further included. That is, the terms used in the present description are only for describing specific embodiments and are not intended to limit the concept of the present description. Furthermore, the examples described to aid the understanding of the present description also include complementary embodiments thereof.

The terms used in the present description have the meaning commonly understood by one of ordinary skill in the art to which the present description belongs. Terms commonly used should be interpreted in a consistent sense in the context of the present description. Further, terms used in the present description should not be interpreted in an idealistic or formal sense unless the meaning is clearly defined. Hereinafter, embodiments of the present description will be described with reference to the accompanying drawings.

Figure 1:
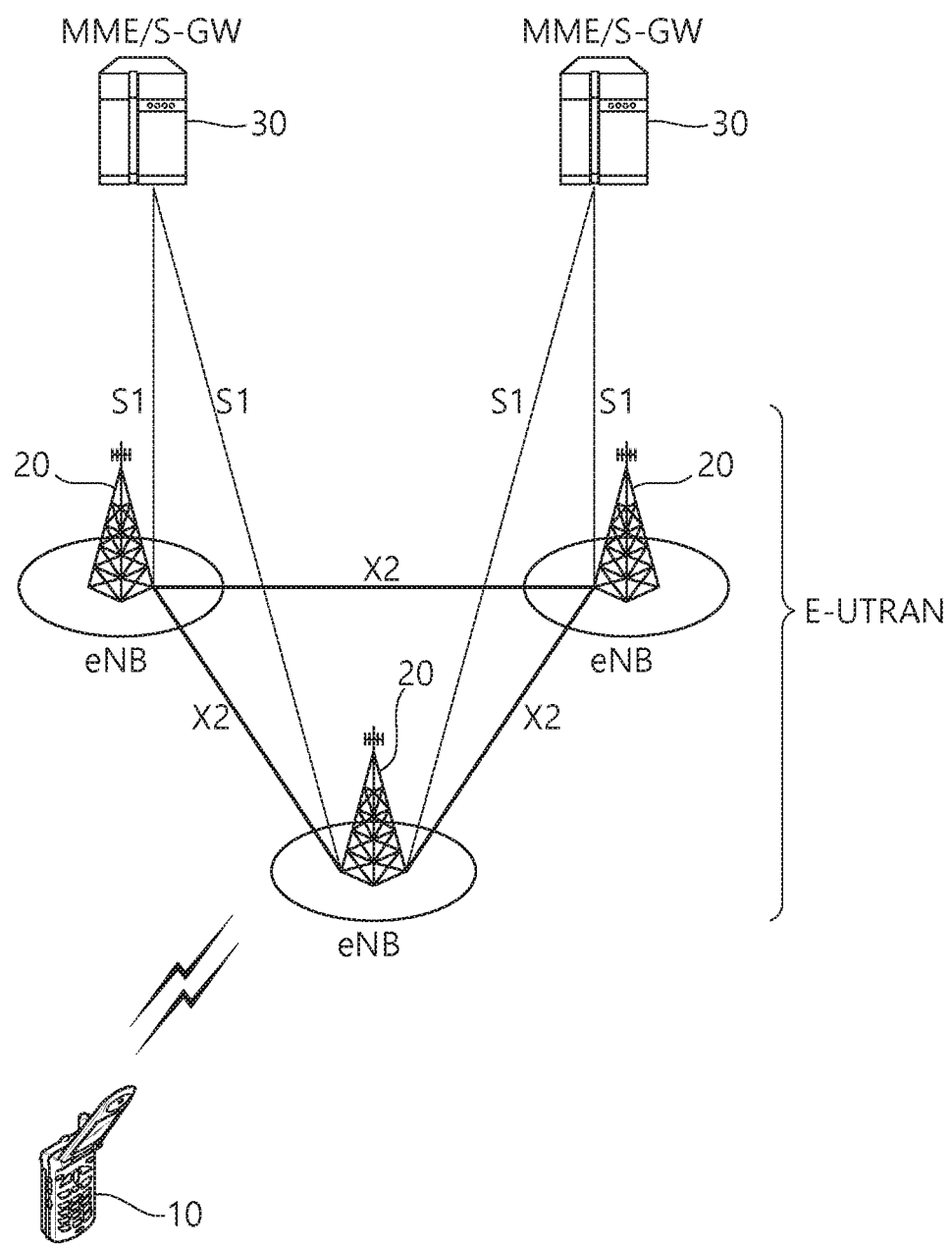
FIG. 1 shows a conventional wireless communication system to which the present description may be applied.

FIG. 1 shows a conventional wireless communication system to which the present description may be applied. The wireless communication system may be referred to as an Evolved-UMTS Terrestrial Radio Access Network (E-UTRAN) or a Long Term Evolution (LTE)/LTE-A system.

The E-UTRAN includes at least one base station (BS) 20 which provides a control plane and a user plane to a user equipment (UE) 10. The UE 10 may be fixed or mobile, and may be referred to as another terminology, such as a mobile station (MS), a user terminal (UT), a subscriber station (SS), a mobile terminal (MT), a wireless device, etc. The BS 20 is generally a fixed station that communicates with the UE 10 and may be referred to as another terminology, such as an evolved node-B (eNB), a base transceiver system (BTS), an access point, etc.

The BSs 20 are interconnected by means of an X2 interface. The BSs 20 are also connected by means of an S1 interface to an evolved packet core (EPC) 30, more specifically, to a mobility management entity (MME) through S1-MME and to a serving gateway (S-GW) through S1-U.

The EPC 30 includes an MME, an S-GW, and a packet data network-gateway (P-GW). The MME has access information of the UE or capability information of the UE, and such information is generally used for mobility management of the UE. The S-GW is a gateway having an E-UTRAN as an end point. The P-GW is a gateway having a PDN as an end point.

Layers of a radio interface protocol between the UE and the network can be classified into a first layer (L1), a second layer (L2), and a third layer (L3) based on the lower three layers of the open system interconnection (OSI) model that is well-known in the communication system. Among them, a physical (PHY) layer belonging to the first layer provides an information transfer service by using a physical channel, and a radio resource control (RRC) layer belonging to the third layer serves to control a radio resource between the UE and the network. For this, the RRC layer exchanges an RRC message between the UE and the BS.

Figure 2:
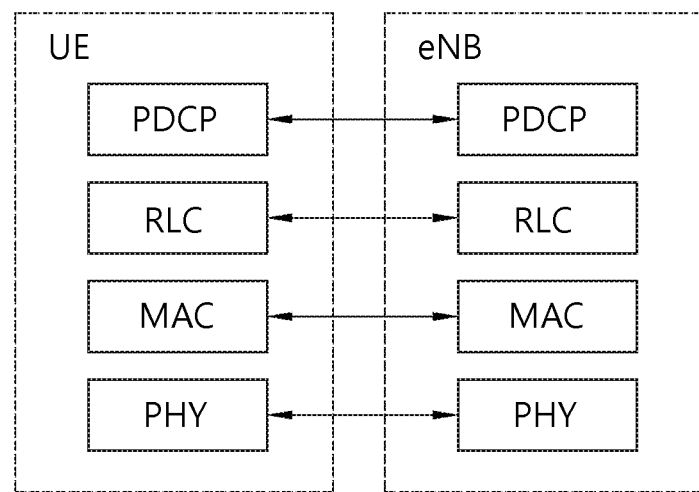
FIG. 2 is a diagram showing a wireless protocol architecture for a user plane.
Figure 3:
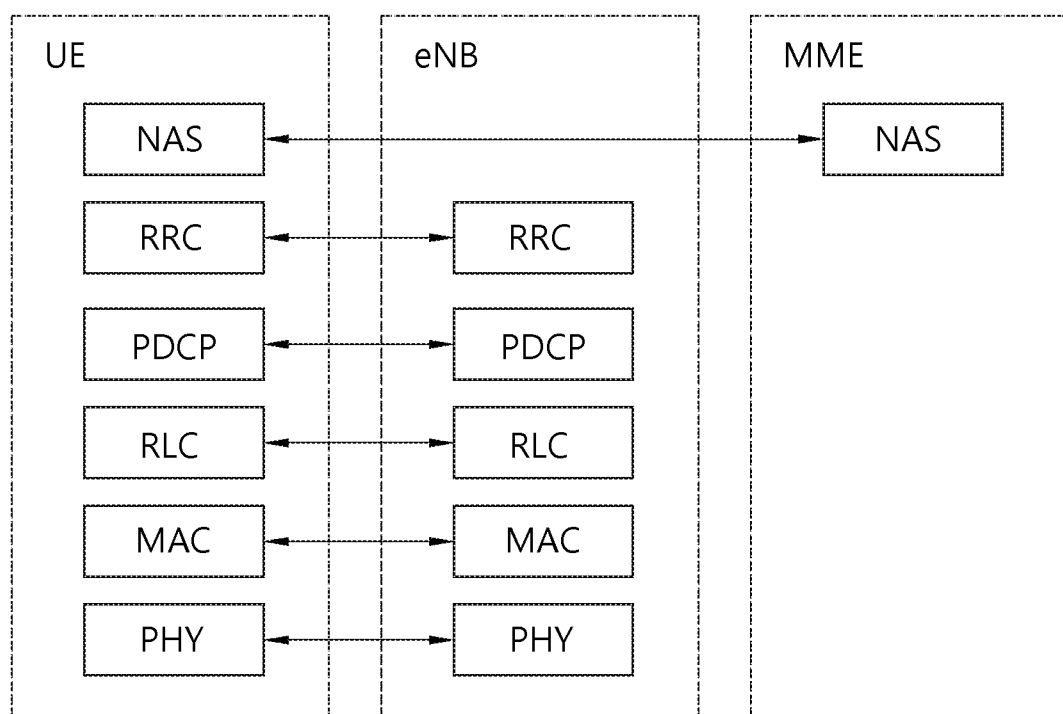
FIG. 3 is a diagram showing a wireless protocol architecture for a control plane.

FIG. 2 is a diagram showing a wireless protocol architecture for a user plane. FIG. 3 is a diagram showing a wireless protocol architecture for a control plane. The user plane is a protocol stack for user data transmission. The control plane is a protocol stack for control signal transmission.

FIG. 3 is a diagram showing a wireless protocol architecture for a control plane.

Referring to FIGS. 2 and 3, a PHY layer provides an upper layer with an information transfer service through a physical channel. The PHY layer is connected to a medium access control (MAC) layer which is an upper layer of the PHY layer through a transport channel. Data is transferred between the MAC layer and the PHY layer through the transport channel. The transport channel is classified according to how and with what characteristics data is transferred through a radio interface.

Data is moved between different PHY layers, that is, the PHY layers of a transmitter and a receiver, through a physical channel. The physical channel may be modulated according to an Orthogonal Frequency Division Multiplexing (OFDM) scheme, and use the time and frequency as radio resources.

The functions of the MAC layer include mapping between a logical channel and a transport channel and multiplexing and demultiplexing to a transport block that is provided through a physical channel on the transport channel of a MAC Service Data Unit (SDU) that belongs to a logical channel. The MAC layer provides service to a Radio Link Control (RLC) layer through the logical channel.

The functions of the RLC layer include the concatenation, segmentation, and reassembly of an RLC SDU. In order to guarantee various types of Quality of Service (QoS) required by a Radio Bearer (RB), the RLC layer provides three types of operation mode: Transparent Mode (TM), Unacknowledged Mode (UM), and Acknowledged Mode (AM). AM RLC provides error correction through an Automatic Repeat Request (ARQ).

The RRC layer is defined only on the control plane. The RRC layer is related to the configuration, reconfiguration, and release of radio bearers, and is responsible for control of logical channels, transport channels, and PHY channels. An RB means a logical route that is provided by the first layer (PHY layer) and the second layers (MAC layer, the RLC layer, and the PDCP layer) in order to transfer data between UE and a network.

The function of a Packet Data Convergence Protocol (PDCP) layer on the user plane includes the transfer of user data and header compression and ciphering. The function of the PDCP layer on the user plane further includes the transfer and encryption/integrity protection of control plane data.

What an RB is configured means a process of defining the characteristics of a wireless protocol layer and channels in order to provide specific service and configuring each detailed parameter and operating method. An RB can be divided into two types of a Signaling RB (SRB) and a Data RB (DRB). The SRB is used as a passage through which an RRC message is transmitted on the control plane, and the DRB is used as a passage through which user data is transmitted on the user plane.

If RRC connection is established between the RRC layer of UE and the RRC layer of an E-UTRAN, the UE is in the RRC connected state. If not, the UE is in the RRC idle state.

A downlink transport channel through which data is transmitted from a network to UE includes a broadcast channel (BCH) through which system information is transmitted and a downlink shared channel (SCH) through which user traffic or control messages are transmitted. Traffic or a control message for downlink multicast or broadcast service may be transmitted through the downlink SCH, or may be transmitted through an additional downlink multicast channel (MCH). Meanwhile, an uplink transport channel through which data is transmitted from UE to a network includes a random access channel (RACH) through which an initial control message is transmitted and an uplink shared channel (SCH) through which user traffic or control messages are transmitted.

Logical channels that are placed over the transport channel and that are mapped to the transport channel include a broadcast control channel (BCCH), a paging control channel (PCCH), a common control channel (CCCH), a multicast control channel (MCCH), and a multicast traffic channel (MTCH).

The physical channel includes several OFDM symbols in the time domain and several subcarriers in the frequency domain. One subframe includes a plurality of OFDM symbols in the time domain. An RB is a resources allocation unit, and includes a plurality of OFDM symbols and a plurality of subcarriers. Furthermore, each subframe may use specific subcarriers of specific OFDM symbols (e.g., the first OFDM symbol) of the corresponding subframe for a physical downlink control channel (PDCCH), that is, an L1/L2 control channel. A Transmission Time Interval (TTI) is a unit time for subframe transmission.

Hereinafter, a new radio access technology (new RAT, NR) will be described.

As more and more communication devices require more communication capacity, there is a need for improved mobile broadband communication over existing radio access technology. Also, massive machine type communications (MTC), which provides various services by connecting many devices and objects, is one of the major issues to be considered in the next generation communication. In addition, communication system design considering reliability/latency sensitive service/UE is being discussed. The introduction of next generation radio access technology considering enhanced mobile broadband communication (eMBB), massive MTC (mMTC), ultrareliable and low latency communication (URLLC) is discussed. This new technology may be called new radio access technology (new RAT or NR) in the present description for convenience.

Figure 4:
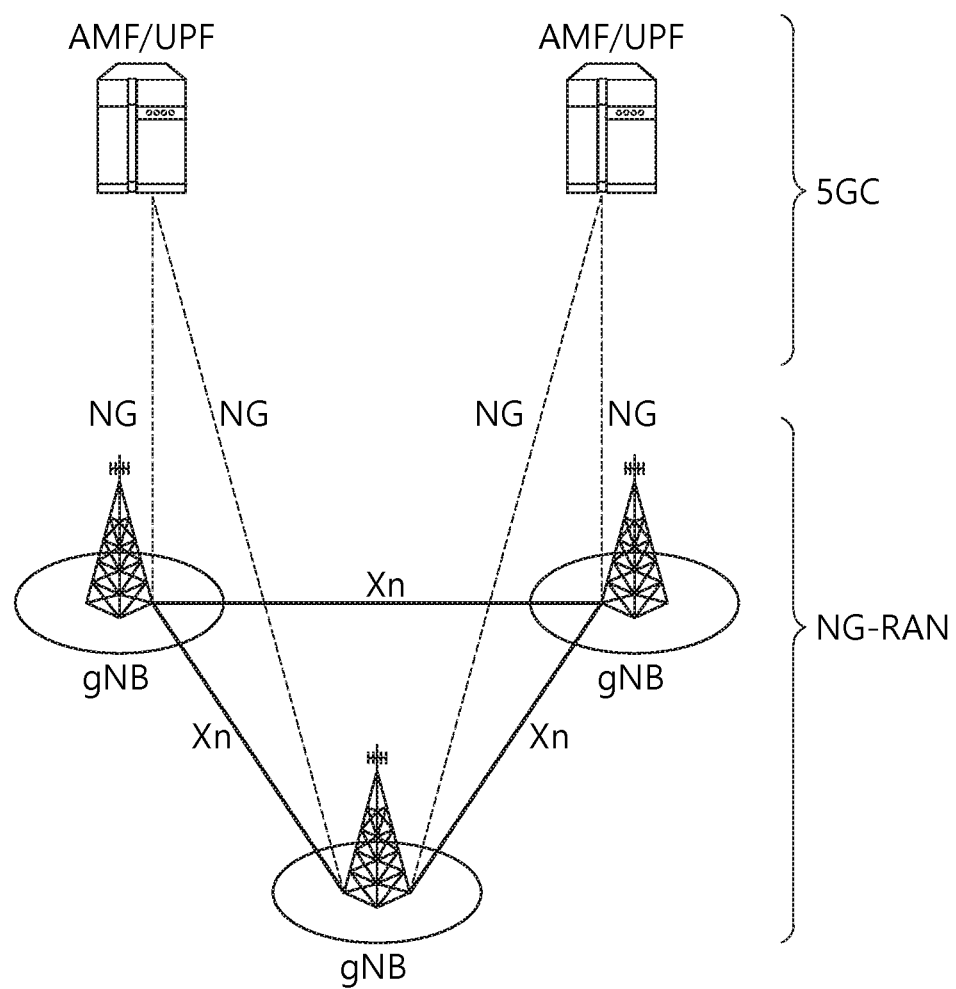
FIG. 4 illustrates a system structure of a next generation radio access network (NG-RAN) to which NR is applied.

FIG. 4 illustrates a system structure of a next generation radio access network (NG-RAN) to which NR is applied.

Referring to FIG. 4, the NG-RAN may include a gNB and/or an eNB that provides user plane and control plane protocol termination to a UE/terminal. FIG. 4 illustrates the case of including only gNBs. The gNB and the eNB are connected by an Xn interface. The gNB and the eNB are connected to a 5G core network (5GC) via an NG interface. More specifically, the gNB and the eNB are connected to an access and mobility management function (AMF) via an NG-C interface and connected to a user plane function (UPF) via an NG-U interface.

The gNB may provide functions such as an inter-cell radio resource management (Inter Cell RRM), radio bearer management (RB control), connection mobility control, radio admission control, measurement configuration & provision, dynamic resource allocation, and the like. The AMF may provide functions such as NAS security, idle state mobility handling, and so on. The UPF may provide functions such as mobility anchoring, PDU processing, and the like. The SMF may provide functions such as UE IP address assignment, PDU session control, and so on.

Figure 5:
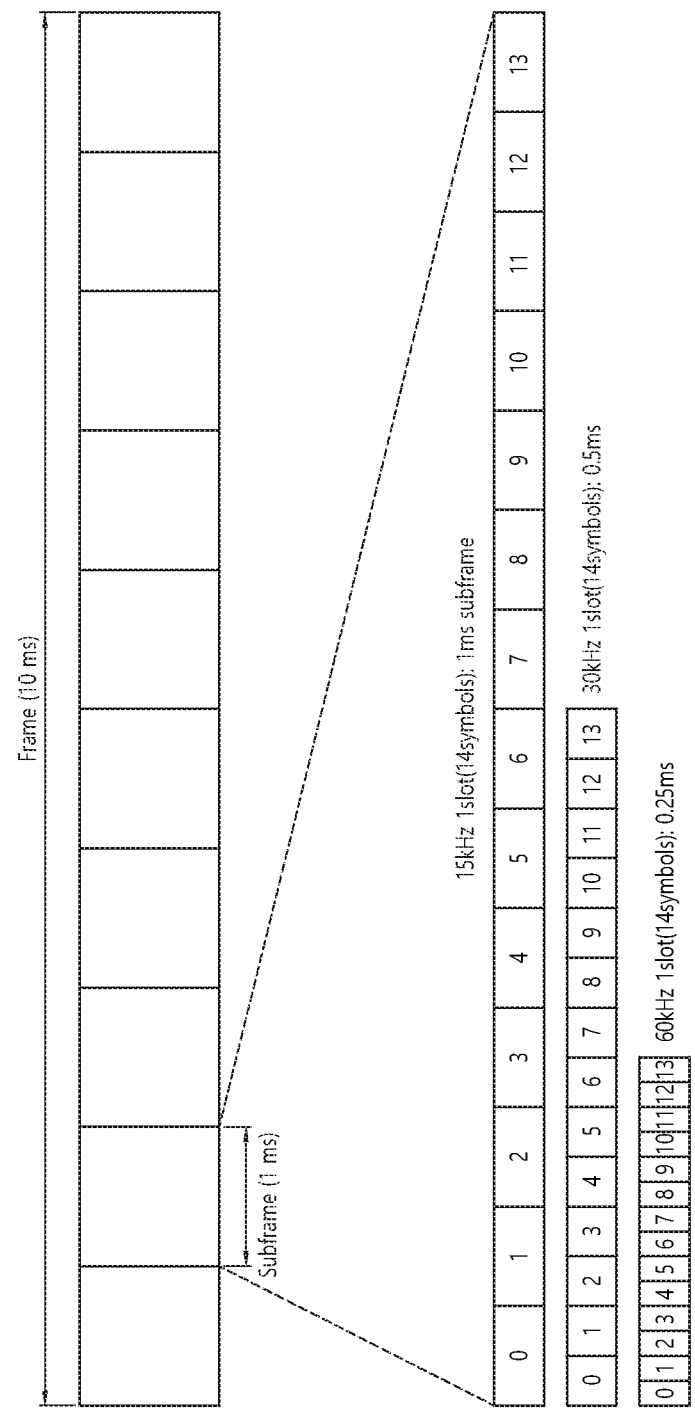
FIG. 5 illustrates an example of a frame structure that may be applied in NR.

FIG. 5 illustrates an example of a frame structure that may be applied in NR.

Referring to FIG. 5, a frame may be composed of 10 milliseconds (ms) and include 10 subframes each composed of 1 ms.

One or a plurality of slots may be included in a subframe according to subcarrier spacings.

The following table 1 illustrates a subcarrier spacing configuration μ.

TABLE 1

| μ | Δf = $2^\mu \cdot 15$[kHz] | Cyclic prefix |
|---|---|---|
| 0 | 15 | Normal |
| 1 | 30 | Normal |
| 2 | 60 | Normal |
|   |    | Extended |
| 3 | 120 | Normal |
| 4 | 240 | Normal |

The following table 2 illustrates the number of slots in a frame ($N^{frame,\mu}_{slot}$), the number of slots in a subframe ($N^{subframe,\mu}_{slot}$), the number of symbols in a slot ($N^{slot}_{symb}$), and the like, according to subcarrier spacing configurations μ.

TABLE 2

| μ | $N^{slot}_{symb}$ | $N^{frame,\mu}_{slot}$ | $N^{subframe,\mu}_{slot}$ |
|---|---|---|---|
| 0 | 14 | 10 | 1 |
| 1 | 14 | 20 | 2 |
| 2 | 14 | 40 | 4 |
| 3 | 14 | 80 | 8 |
| 4 | 14 | 160 | 16 |

In FIG. 5, μ=0, 1, 2 is illustrated.

A physical downlink control channel (PDCCH) may include one or more control channel elements (CCEs) as illustrated in the following table 3.

TABLE 3

| Aggregation level | Number of CCEs |
|---|---|
| 1 | 1 |
| 2 | 2 |
| 4 | 4 |
| 8 | 8 |
| 16 | 16 |

In the present description, an aggregation level (hereinafter, AL) may be associated with the number of one or more CCEs allocated for the PDCCH.

That is, the PDCCH may be transmitted through a resource including 1, 2, 4, 8, or 16 CCEs. Here, the CCE includes six resource element groups (REGs), and one REG includes one resource block in a frequency domain and one orthogonal frequency division multiplexing (OFDM) symbol in a time domain.

Meanwhile, in a future wireless communication system, a new unit called a control resource set (CORESET) may be introduced. The UE may receive the PDCCH in the CORESET.

Figure 6:
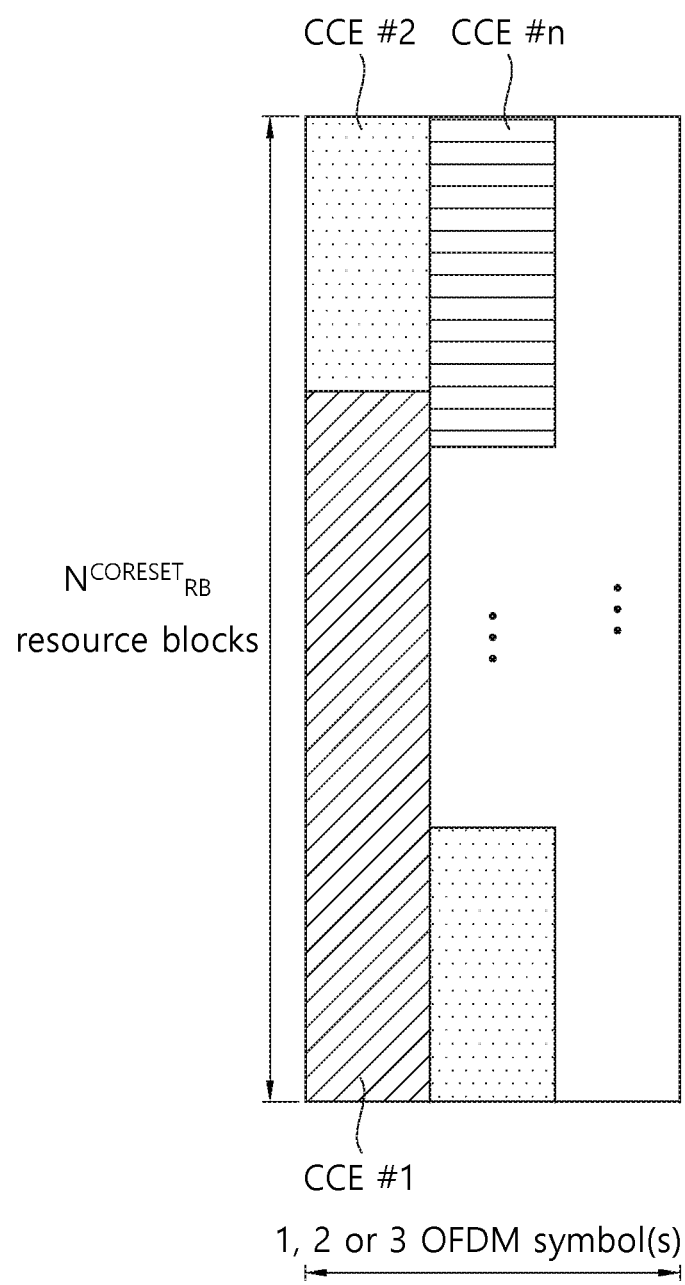
FIG. 6 illustrates CORESET.

FIG. 6 illustrates CORESET.

Referring to FIG. 6, the CORESET includes $N^{CORESET}_{RB}$ number of resource blocks in the frequency domain, and $N^{CORESET}_{symb} \in \{1, 2, 3\}$ number of symbols in the time domain. $N^{CORESET}_{RB}$ and $N^{CORESET}_{symb}$ may be provided by a base station via higher layer signaling.

For example, a frequency domain and time domain related to CORESET may be defined based on an RRC signaling message of a higher layer.

As illustrated in FIG. 6, a plurality of CCEs (or REGs) may be included in the CORESET.

The UE may attempt to detect a PDCCH in units of 1, 2, 4, 8, or 16 CCEs in the CORESET. One or a plurality of CCEs in which PDCCH detection may be attempted may be referred to as PDCCH candidates.

A plurality of CORESETs may be configured for the UE.

Figure 7:
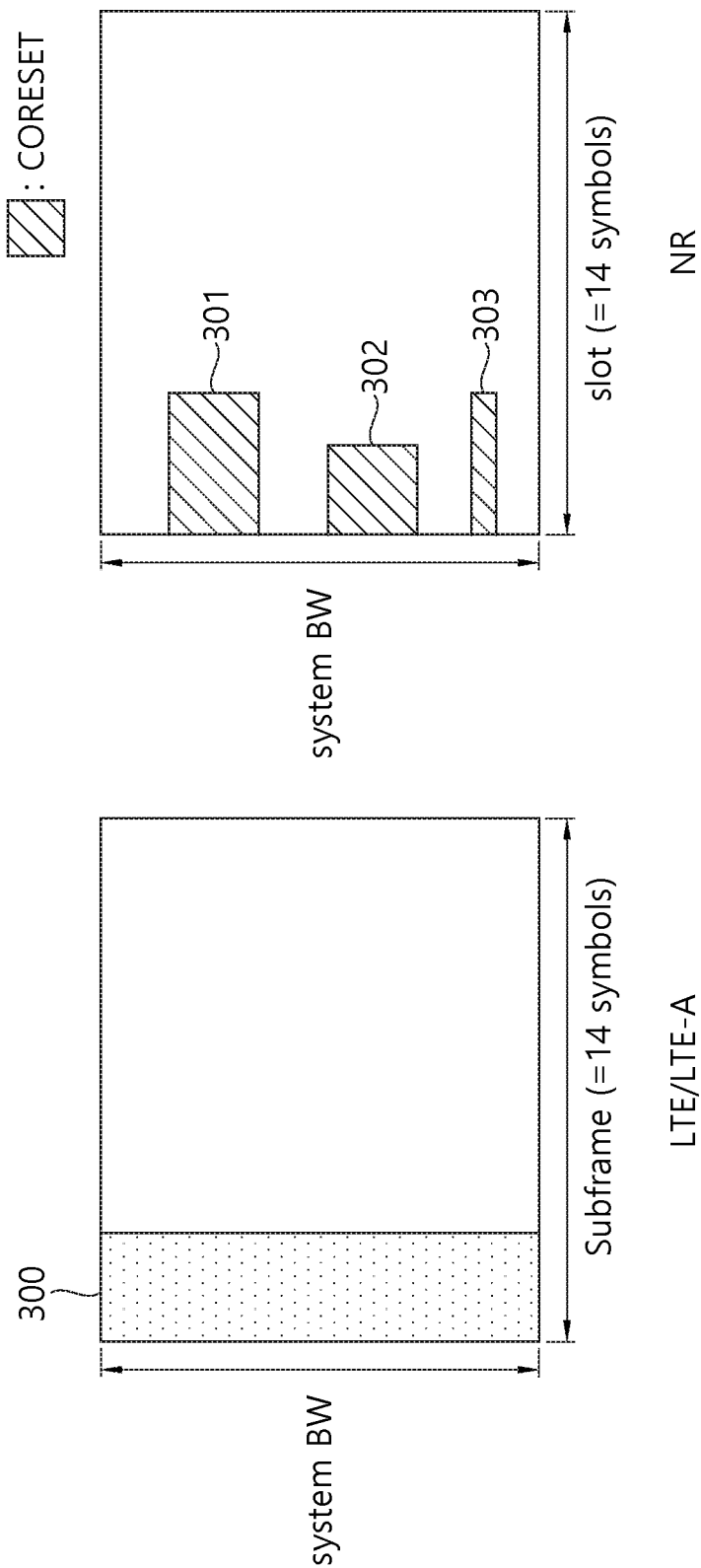
FIG. 7 is a diagram illustrating a difference between a related art control region and the CORESET in NR.

FIG. 7 is a diagram illustrating a difference between a related art control region and the CORESET in NR.

Referring to FIG. 7, a control region 300 in the related art wireless communication system (e.g., LTE/LTE-A) is configured over the entire system band used by a base station (BS). All the terminals, excluding some (e.g., eMTC/NB-IoT terminal) supporting only a narrow band, must be able to receive wireless signals of the entire system band of the BS in order to properly receive/decode control information transmitted by the BS.

On the other hand, in NR, CORESET described above was introduced. CORESETs 301, 302, and 303 are radio resources for control information to be received by the UE and may use only a portion, rather than the entirety of the system bandwidth. The BS may allocate the CORESET to each UE and may transmit control information through the allocated CORESET. For example, in FIG. 7, a first CORESET 301 may be allocated to UE 1, a second CORESET 302 may be allocated to UE 2, and a third CORESET 303 may be allocated to UE 3. In the NR, the UE may receive control information from the BS, without necessarily receiving the entire system band.

The CORESET may include a UE-specific CORESET for transmitting UE-specific control information and a common CORESET for transmitting control information common to all UEs.

Meanwhile, in the NR, high reliability may be required according to an application field. In this situation, a target block error rate (BLER) for downlink control information (DCI) transmitted via a downlink control channel (e.g., a physical downlink control channel (PDCCH)) may be significantly lower than the conventional technique. As an example of a method for satisfying a requirement which requires the high reliability, an amount of contents included in the DCI may be decreased and/or an amount of resources used in DCI transmission may be increased. In this case, the resource may include at least one of a resource in a time domain, a resource in a frequency domain, a resource in a code domain, and a resource in a spatial domain.

In the NR, the following technique/feature may be applied.

Figure 8:
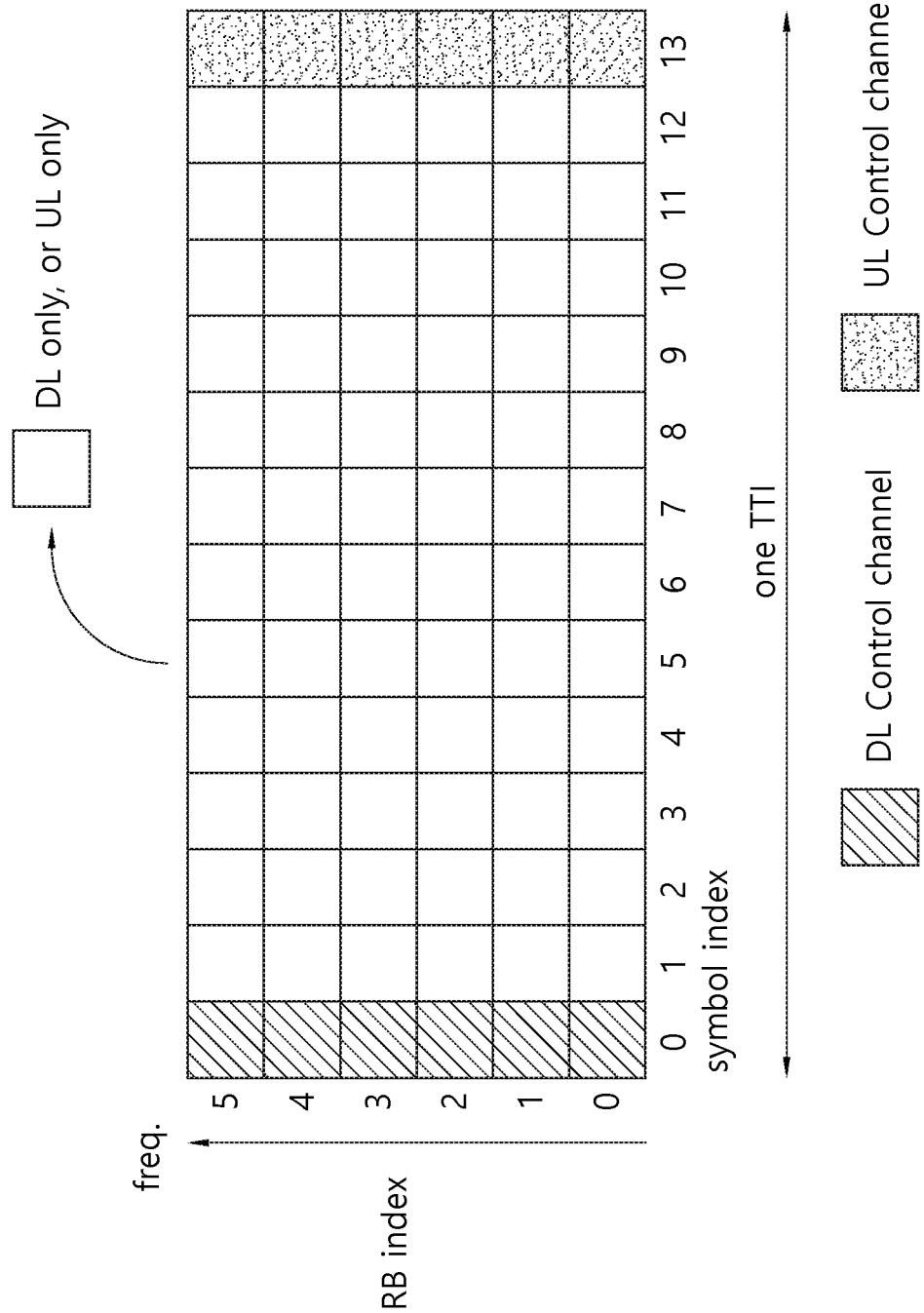
FIG. 8 shows an example of a frame structure that can be used in NR.

FIG. 8 shows an example of a frame structure that can be used in NR.

Referring to FIG. 8, for the purpose of minimizing a latency in the NR, a structure in which a control channel and a data channel are subjected to time division multiplexing (TDM) within one TTI may be considered as one of frame structures.

In FIG. 8, an area indicated by hatched lines represents a downlink control region, and an area in black represents an uplink control region. An unmarked area may be used for downlink data (or DL data) transmission or for uplink data (or UL data) transmission.

According to the frame structure of FIG. 8, DL transmission and UL transmission may be sequentially performed in one subframe.

In other words, DL data may be transmitted and UL ACK/NACK may be received in the subframe. Consequently, a time required until data is retransmitted is reduced when a data transmission error occurs, thereby minimizing a latency of final data transmission.

In a self-contained subframe structure of FIG. 8, a time gap may be required for a process of switching from a transmission mode to a reception mode or a process of switching from the reception mode to the transmission mode in a base station (BS) and a user equipment (UE).

For this, some OFDM symbols at a time of switching from DL to UL in the self-contained subframe structure may be set to a guard period (GP).

Figure 9:
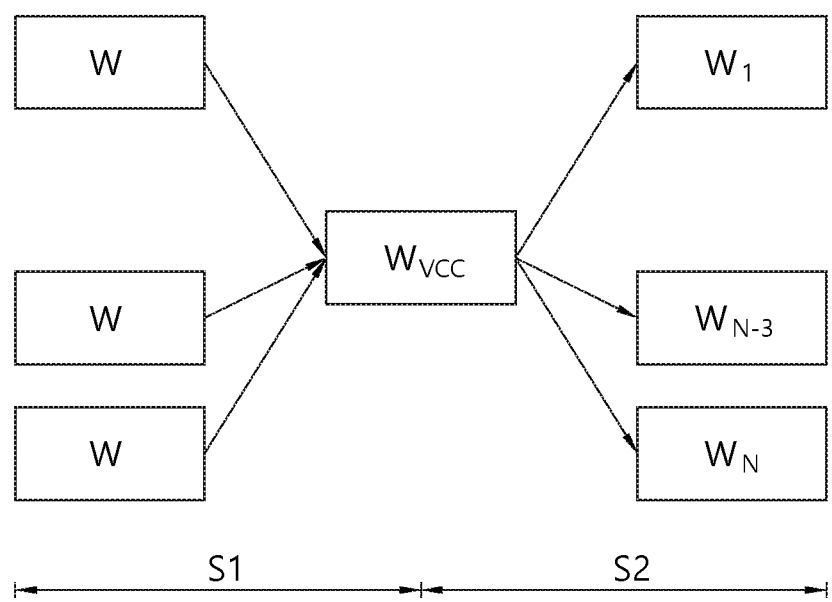
FIG. 9 shows the concept of polar encoding.

FIG. 9 shows the concept of polar encoding.

Referring to FIG. 9, a polar encoding process using a polar code may include a channel combining step S1 and a channel splitting step S2.

Referring to FIG. 9, a plurality of basic channels W may be properly combined to generate a vector channel Wvcc. In addition, the generated vector channel Wvcc may be split to generate polarized new channels. For example, for a channel having an infinite length, a channel capacity may be classified into a channel capacity C(W)=0 and a channel capacity C(W)=1.

For example, a channel of which a channel capacity C(W) is '1' may be allocated for transmission of an information bit since error-free transmission is possible. A channel of which a channel capacity C(W) is '0' may be allocated for transmission of a frozen bit which is a meaningless bit since transmission information transmission is impossible.

Figure 10:
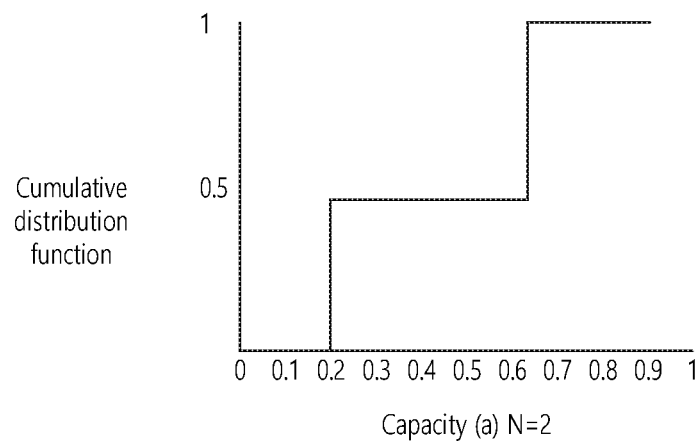
FIG. 10 shows a polarization tendency depending on a length of a code block.
Figure 10:
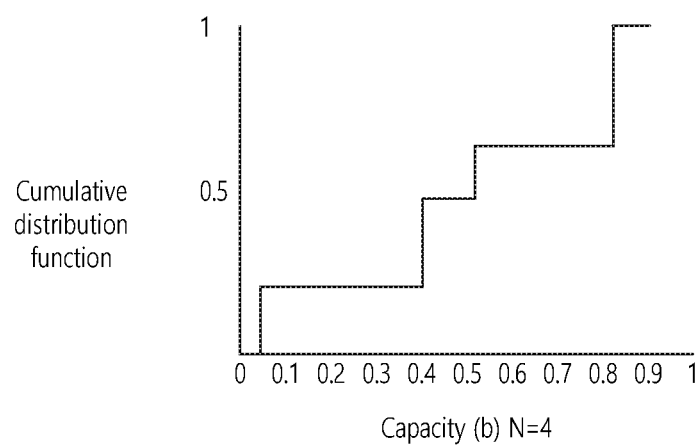
Figure 10:
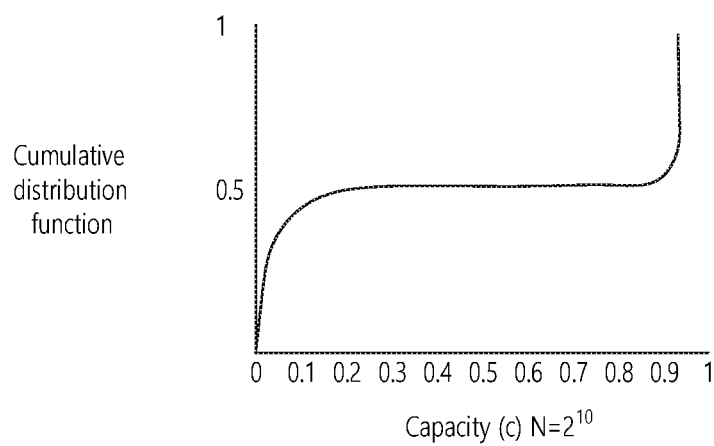

FIG. 10 shows a polarization tendency depending on a length of a code block.

Referring to (a) to (c) of FIG. 10, it will be understood that a channel capacity is polarized to 1 or 0 with an increase in a length N of a code block.

Figure 11:
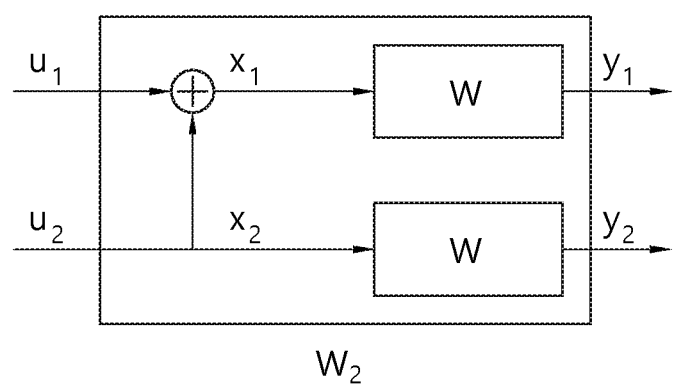
FIG. 11 shows a base module of a polar code.

FIG. 11 shows a base module of a polar code.

Referring to FIG. 9 to FIG. 11, the aforementioned channel combination may be performed by permuting binary-input discrete memoryless channels (B-DMCs) in parallel.

For example, a size of the code block may be determined based on a channel combination. For example, in FIG. 11, W may denote a B-DMC. The base module of the polar code of FIG. 11 may combine two B-DMCs.

For example, u1 and u2 of FIG. 11 may be binary-input source bits. x1 and x2 of FIG. 11 may be an input to a corresponding channel W. y1 and y2 of FIG. 11 may be output coded bits. In addition, a channel equivalent to the entire channel may be denoted by W2.

For example, a result value of an XOR operation of u1 and u2 may be included in x1. In addition, u2 may be included in x2 without an additional operation. Eventually, a base matrix F for the base module of the polar code of FIG. 11 may be expressed by Equation 1 below.

$$F = \begin{bmatrix} 1 & 0 \\ 1 & 1 \end{bmatrix}$$ [Equation 1]

If N B-DMCs are combined, each channel may be expressed in a recursive form. In addition, a vector x for an output bit of an encoder may be expressed by using Equation 2 below.

$$X_1^N = u_1^N G_N$$ [Equation 2]

Referring to Equation 2 above, the vector x for the output bit of the encoder may be expressed by Equation 3 below, and a vector u for an input bit of the encoder may be expressed by Equation 4 below.

$$X_1^N = \{X_1, \ldots, X_N\} \quad \text{[Equation 3]}$$

$$u_1^N = \{u_1, \ldots, u_N\} \quad \text{[Equation 4]}$$

For example, in a polar code of a length-N code block, a code rate is N/K assuming that K bits are input. In this case, among {u1, uN}, K bits may be understood as bits for payload.

In addition, referring to Equation 2 above, a generation matrix $G_N$ may be expressed in a form of a Kronecker product of the base matrix F of Equation 1.

$$G_N = F^{\otimes N} \quad \text{[Equation 5]}$$

$$F^{\otimes N} = F \otimes F^{\otimes (N-1)} \text{(but,} F^{\otimes (0)} = 1) \quad \text{[Equation 6]}$$

For example, according to Equation 5 and Equation 6, a 2×2-sized generation matrix $G_1$ may be as shown in Equation 2.

In addition, a 4×4-sized generation matrix $G_2$ may be as shown in Table 4 below.

TABLE 4

$$\begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

In addition, an 8×8-sized generation matrix $G_3$ may be as shown in Table 5 below.

TABLE 5

$$\begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

In the present description, a generation matrix $G_N$ according to Equation 5 and Equation 6 above may be referred to as a mother matrix predetermined based on a polar code.

In addition, in the present description, an operation for a bit-reverse permutation may exist not in an encoding part but in a decoding part.

Figure 12:
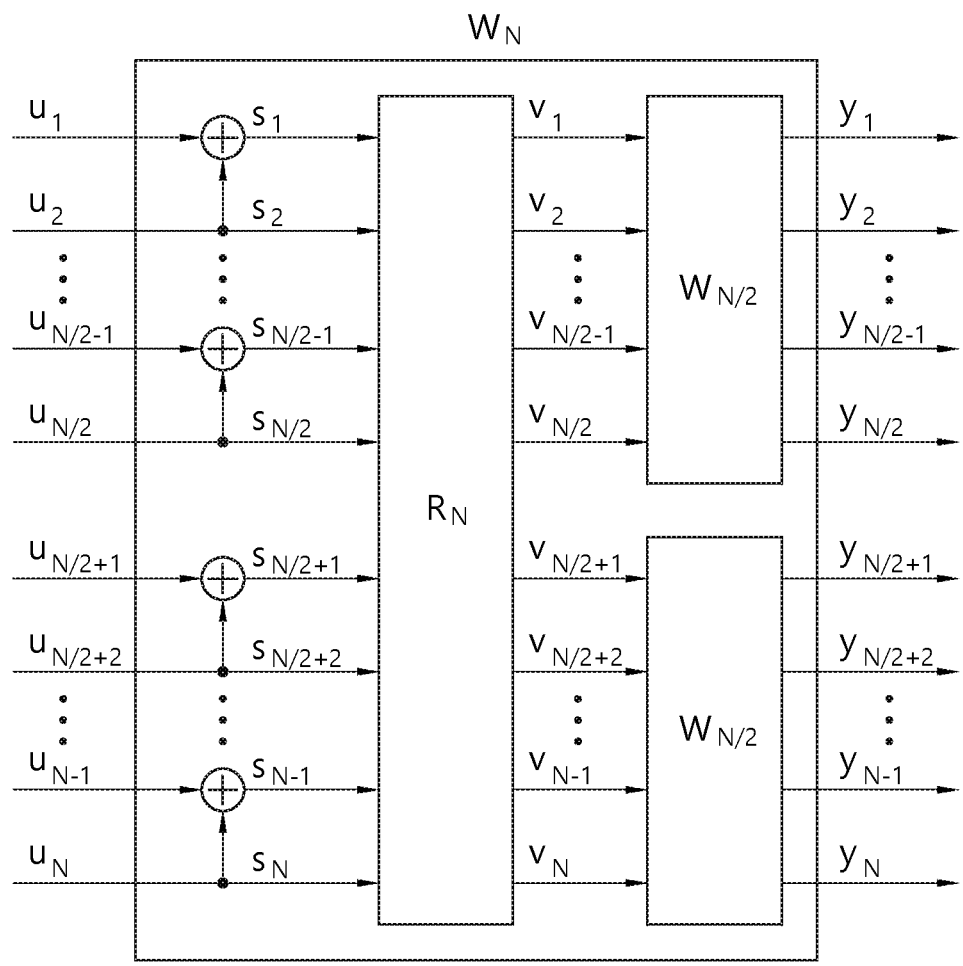
FIG. 12 is a drawing for an example of a channel combination having a level N.

FIG. 12 is a drawing for an example of a channel combination having a level N. For example, it may be understood in FIG. 12 that an operation for a bit-reverse permutation exists in an encoding part. Referring to FIG. 4, a size N of a code block may have a restriction of 2^n (where n is a natural number).

For example, decoding of a polar code may be performed by using successive cancellation (SC) decoding. Herein, an SC decoding scheme may be performed by calculating a channel transition probability and then by calculating a likelihood ratio (LLR) for an input bit on the basis of the calculated probability.

In this case, given that channel combining and channel splitting processes are recursive, the channel transition probability may be calculated recursively. That is, an LLR value may also be calculated recursively.

Hereinafter, a payload bit on which data is transmitted may be referred to as a data bit, and the remaining bits (e.g., bits on which actual data is not transmitted) other than the payload bit may be referred to as a frozen bit.

In the polar code, a location of a bit to be determined as a data bit or a frozen bit in the code block may be an issue to be considered. For example, a location of the data bit and a location of the frozen bit may be determined based on a channel capacity of each channel.

Figure 13:
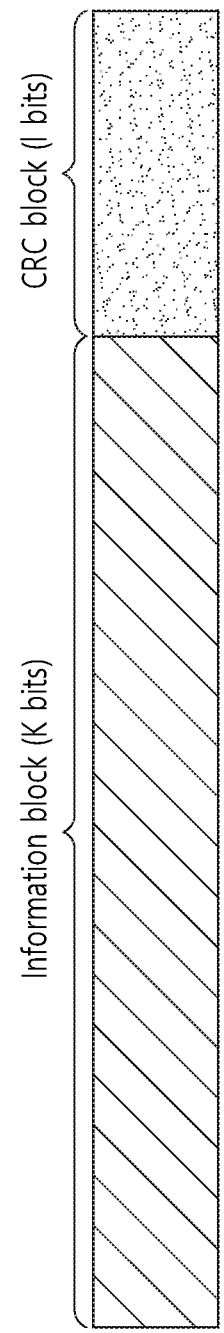
FIG. 13 and FIG. 14 show a structure of an input bit based on a cyclic redundancy check (CRC) block.
Figure 14:
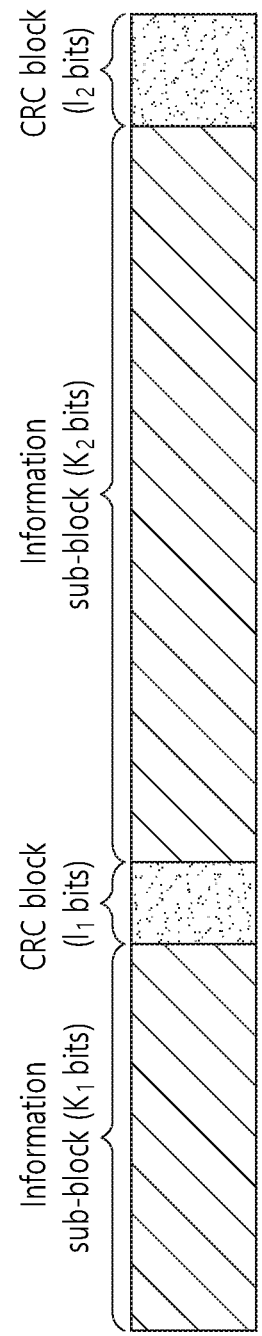

FIG. 13 and FIG. 14 show a structure of an input bit based on a cyclic redundancy check (CRC) block.

In the present description, a CRC-Aided-List (CAL) decoding method related to a polar code may be applied. For example, in the CAL decoding method, L (>=1) candidate information bits (i.e., $\{\bar{u}_i : i=1, \ldots, L\}$) may be first decoded.

In addition, among one or more candidate information bits, a candidate bit information which passes CRC-check may be selected as a decoded information bit.

Referring to FIG. 13, when a conventional CRC structure is applied for an input bit, a CRC block (i.e., 1 CRC bit) may be located next to an information block (i.e., k information bits).

Referring to FIG. 14, when a distributed CRC structure is applied to improve a decoding speed of the CAL decoding method for an input bit, a plurality of CRC blocks (i.e., 11 CRC bits, 12 CRC bits) may be located in a distributed manner in a plurality of information sub-blocks (K1 information bits, K2 information bits).

When the distributed CRC structure is applied as shown in FIG. 14, some of information bits (e.g., K1 information bits) and some of CRC bits (e.g., 11 CRC bits) may be decoded in the CAL decoding process, and this may be used to perform CRC-check.

Herein, if all of L candidate information bits fail in CRC-check, an error may be declared to stop decoding.

Figure 15:
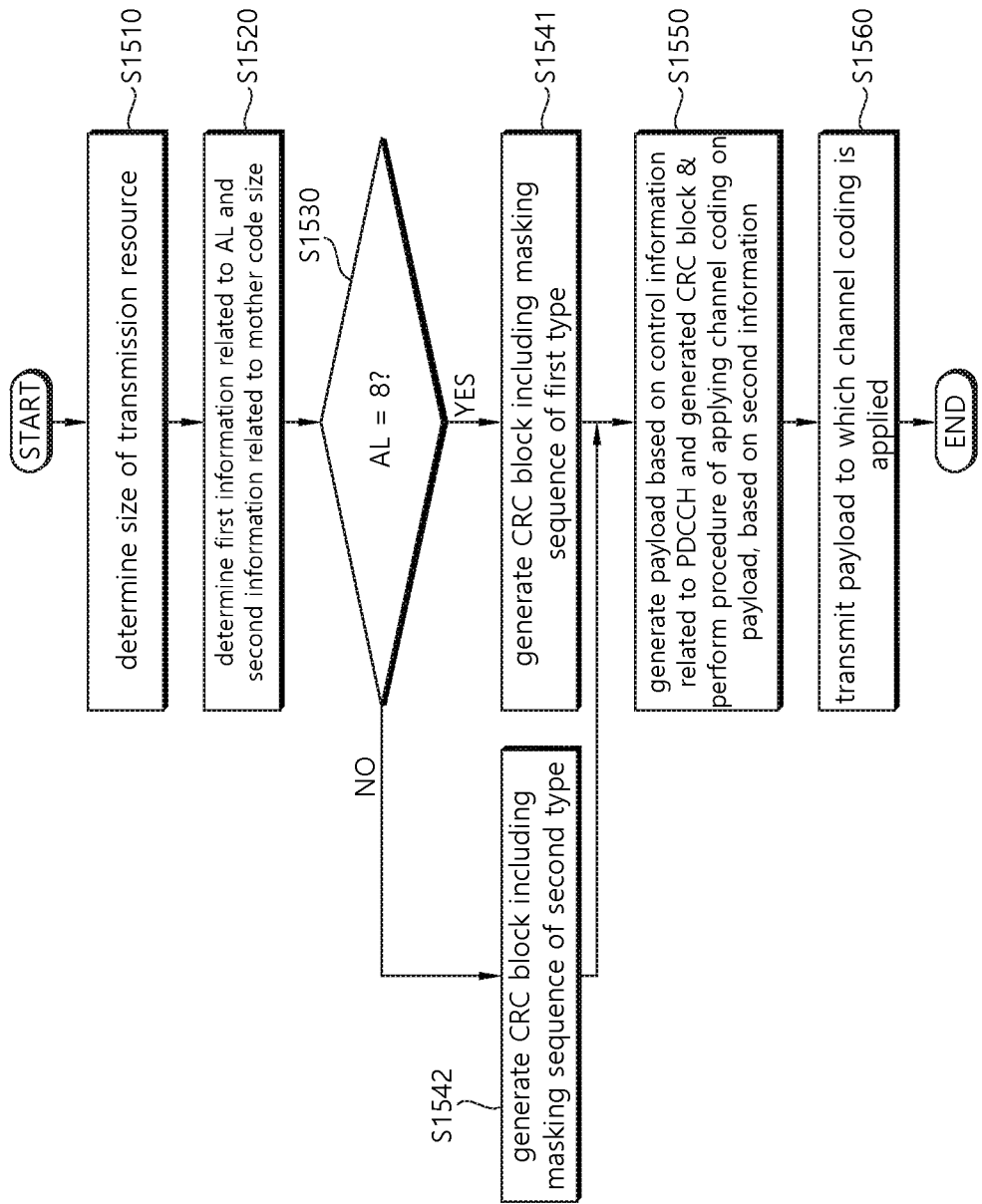
FIG. 15 is a flowchart showing a method of operating a communication device in a wireless communication system according to a present embodiment.

FIG. 15 is a flowchart showing a method of operating a communication device in a wireless communication system according to a present embodiment.

In NR, the polar code mentioned in FIG. 9 to FIG. 12 may be applied to channel coding for a control channel (e.g., PDCCH).

In addition, in NR, a scheduled PDSCH may be transmitted at a position remaining after a PDCCH is transmitted. Accordingly, a UE may first perform blind decoding on the PDCCH, and thereafter may decode the scheduled PDSCH in the remaining region.

For reference, it is mentioned that the scheduled PDSCH is rate-matched around the PDCCH scheduling the PDSCH.

Referring to FIG. 1 to FIG. 15, in step S1510, the communication device may determine a size of a transmission resource. For example, the size of the transmission resource may be related to a size of control information related to the PDCCH.

In step S1520, the communication device may determine first information related to an aggregation level (AL) for the PDCCH of Table 3 and second information related to a mother code size for a polar code.

For example, the AL may be related to a first level to a fifth level. Herein, the first level to the fifth level may correspond to {1, 2, 4, 8, 16}.

For example, the mother code size may be related to a first size to a third size. Herein, the first size to the third size may correspond to {128, 256, 512}.

For example, the first information may be determined to any one of values of {1, 2, 4, 8, 16}, based on a length of control information for a PDCCH.

For example, the mother code size may correspond to a length of a row or column of a mother matrix (i.e., a generation matrix $G_N$ defined based on Equation 5 and Equation 6 of FIG. 11) used in a procedure of applying channel coding based on the polar code.

For example, the second information may be determined based on the first information. For example, when the first information is related to the first level (i.e., 1), the second information may be determined to the first size (i.e., 128).

For example, when the first information is related to the second level (i.e., 2), the second information may be determined to the second size (i.e., 256). For example, when the first information is related to any one of the third level to the fifth level (i.e., 4, 8, 16), the second information may be determined to the third size (i.e., 512).

In NR, the number of resource elements (REs) that can be used per one resource block (RB) may be 12. In addition, the number of REs for transmitting a payload (including CRC) may be 9, when excluding 3 REs for a reference signal (hereinafter, RS) from the 12 REs.

In addition, 6 RBs may be used for DCI transmission. Accordingly, when the AL is determined to any one of {1, 2, 4, 8, 16}, the number of REs may be set to a value of a corresponding position in {54, 108, 216, 432, 862}.

Likewise, the number of QPSK symbols for a control channel (i.e., PDCCH) may be determined to any one of {54, 108, 216, 432, 862}. Consequently, when the AL is determined to any one of {1, 2, 4, 8, 16}, a maximum length of coded bits related to the control channel (i.e., PDCCH) may be a value of a corresponding position in {108, 216, 432, 862, 1724}.

In the present description, the mother code size based on the polar code applied to downlink transmission of the control channel may be '512'.

For example, when the AL is determined to any one of {1, 2, 4}, a puncturing operation for the mother matrix based on the polar code may be accompanied. In addition, when the AL is determined to any one of {8, 16}, a repetition operation for the mother matrix based on the polar code may be accompanied.

Accordingly, when the AL is determined to any one of {1, 2, 4, 8, 16}, the second information related to the size of the mother code based on the polar code may be set to a value of a corresponding position in {128, 256, 512, 512, 512}.

For clear and simple understanding of the present description, it is assumed that the AL determined by a BS is '16'. When the AL is '4', '8', or '16', a mother code size (i.e., 512) which is the same as in a case where the AL is '16' is used. That is, a receiving UE placed in a fading environment may decode the received control channel (i.e., PDCCH) by using an incorrect AL value.

As such, when decoding succeeds based on the incorrect AL value, decoding on the scheduled PDSCH always fails.

In NR, a predetermined radio network temporary identifier (RNTI) may be masked to a CRC bit for the PDCCH.

According to the present description, in order to decode the control channel (i.e., PDCCH) only at a correct AL, a masking sequence for identifying the AL may be added to a CRC block having a specific length.

Herein, as in the example below, three types of masking sequences may be configured to have orthogonality with each other.

For example, when a masking sequence length is 4 bits, for AL=4, 8, 16, "0000", "1111", "1010" may be used as a masking sequence.

In addition, sequences that can be identified from each other may also be used for a masking sequence with a length of at least 5 bits.

For example, when the masking sequence length is 5 bits, for AL=4, 8, 16, "00000", "11111", "10101" may be used as a masking sequence. For example, when the masking sequence length is 6 bits, for AL=4, 8, 16, "000000", "111111", "101010" may be used as a masking sequence.

Unlike the aforementioned example, according to the present description, in order to clearly identify the case of AL=4, 8, 16, encoding/decoding may be performed only with two types of masking sequences.

In step S1530, the communication device may decide whether the determined first information is determined to the third level. For example, the communication device may decide whether the AL determined in step S1520 '8'.

For reference, in the present embodiment, a reason of deciding whether the AL is '0' is as follows.

For example, when determined to AL=16, the receiving UE may decode the received PDCCH based on incorrect AL information (e.g., 4, 8).

As another example, when determined to AL=8, the receiving UE may decode the received PDCCH based on the incorrect AL information (i.e., 4). However, when determined to AL=8, since the scheduled PDSCH is located in the remaining region in which a region of AL=8 is excluded from a region of AL=16, the receiving UE cannot decode the received PDCCH based on AL=16.

That is, when determined to AL=4, decoding is performed based on correct AL information (i.e., 4).

In addition, when determined to AL=16, a probability that decoding succeeds based on AL=4 may be lower than a probability that decoding succeeds based on AL=8.

Therefore, according to the present embodiment, a masking sequence for identifying AL=8 may be required.

For reference, the probability that decoding succeeds based on AL=4 is low because puncturing is used as a rate matching scheme when AL=4, and repetition is used in the other cases (AL=8, 16).

In other words, in the other cases (AL=8, 16), the same mother code size is used, and thus decoding can be performed based on incorrect AL without error when an SNR differs by more than a repetition gain.

Otherwise, when AL=4, since a coded bit length is 432, a coding gain of 80 bits (=512-432) is added. That is, when a difference is greater than or equal to repetition gain+80 bit coding gain, decoding may be performed based on incorrect AL without error.

In step S1541, when it is decided that the first information is determined to the third level (i.e., AL=8), the communication device may generate a CRC block including a masking sequence of a first type.

For example, when the masking sequence length is 4 bits, a masking sequence for AL=8 may be set to "1111".

For example, when a start bit position for the CRC block is '0', the masking sequence of the first type may be included in a position in the CRC block ranging from (CRC length-$N_{RNTI}$)-1 to (CRC length-$N_{RNTI}$-masking sequence length)-1.

Specifically, when CRC length=24, $N_{RNTI}$=16, masking sequence length=4, the position in the CRC block of the masking sequence of the first type ranges from 7(=24-16-1) to 3(=24-16-4-1).

For reference, since the masking effect of the masking sequence of the first type does not vary even if the mapping order is changed at a corresponding position, a mapping start position may be (CRC length-$N_{RNTI}$)-1 or (CRC length-NRNTI-masking sequence length)-1.

In step S1542, when it is decided that the first information is determined to another level (i.e., AL=1, 2, 4, 16) other than the third level, the communication device may generate a CRC block including a masking sequence of a second type.

For example, when the masking sequence length is 4 bits, the masking sequence for AL=1, 2, 4, 16 may be set to "0000".

For example, when a start bit position for the CRC block is '0', the masking sequence of the second type may be included in a position in the CRC block ranging from (CRC length-$N_{RNTI}$)-1 to (CRC length-$N_{RNTI}$-masking sequence length)-1.

Specifically, when CRC length=24, $N_{RNTI}$=16, masking sequence length=4, the position in the CRC block of the masking sequence of the second type ranges from 7(=24-16-1) to 3(=24-16-4-1).

For reference, since the masking effect of the masking sequence of the second type does not vary even if the mapping order is changed at a corresponding position, a mapping start position may be (CRC length-NRNTI)-1 or (CRC length-NRNTI-masking sequence length)-1.

For reference, a sequence length may vary depending on a probability that decoding succeeds with incorrect AL.

In step S1550, the communication device may generate a payload based on control information related to the PDCCH and the CRC block generated in the previous steps (i.e., S1541 or S1542). In addition, the communication device may perform a procedure of applying channel coding to the payload, based on the second information determined in step S1520.

As described above, when the first information related to the AL is determined to any one of {1, 2, 4, 8, 16}, the second information related to the size of the mother code based on the polar code may be set to a value of a corresponding position in {128, 256, 512, 512, 512}.

For example, when the first information related to the AL is set to '1', the second information related to the size of the mother code based on the polar code may be set to '128'. In this case, a size of a mother matrix used for the procedure of applying channel coding based on the polar code may be 128×128.

For example, when the first information related to the AL is set to '2', the second information related to the size of the mother code based on the polar code may be set to '256'. In this case, the size of the mother matrix used for the procedure of applying channel coding based on the polar code may be 256×256.

For example, when the first information related to the AL is set to any one of '4', '8', '16', the second information related to the size of the mother code based on the polar code may be set to '512'. In this case, the size of the mother matrix used for the procedure of applying channel coding based on the polar code may be 512×512.

In step S1560, the communication device may transmit a payload to which channel coding is applied (i.e., a coded PDCCH) to a second communication device (e.g., UE).

For example, the coded PDCCH may be transmitted based on the transmission resource determined in step S1510. For example, the coded PDCCH may include information related to the scheduled PDSCH (e.g., a length of the scheduled PDSCH).

Figure 16:
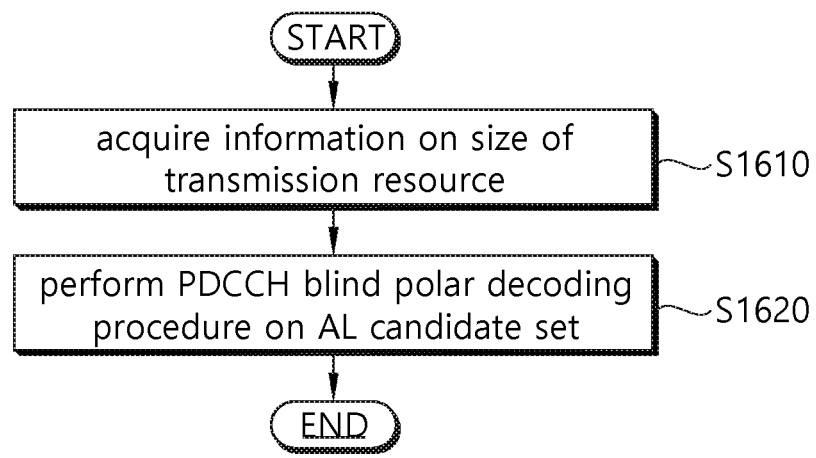
FIG. 16 is a flowchart showing a method of operating a communication device in a wireless communication system according to another present embodiment.

FIG. 16 is a flowchart showing a method of operating a communication device in a wireless communication system according to another present embodiment.

Referring to FIG. 1 to FIG. 16, in step S1610, the communication device may acquire information on a size of a transmission resource related to a PDCCH.

For example, the information on the size of the transmission resource related to the PDCCH may be received from a higher layer (e.g., an L2 layer or an L3 layer). For example, the transmission resource related to the PDCCH may correspond to CORESET mentioned above with reference to FIG. 5 and FIG. 6.

In step S1620, the communication device may perform a PDCCH blind polar decoding procedure based on the information related to the size of the transmission resource.

For example, the PDCCH blind polar decoding procedure may be performed on an AL candidate set (i.e., AL=1, 2, 4, 8, 16) according to a predetermined order.

For clear and simple understanding of FIG. 16, it may be assumed that the PDCCH blind polar decoding procedure is performed according to the order of AL=1, 2, 4, 8, 16. In addition, in a step of PDCCH transmission performed by a BS, it may be assumed that AL is set to '16'.

In the present description, the PDCCH blind polar decoding procedure may be understood as an operation of performing polar decoding several times, by using an AL value based on a predetermined order of a AL candidate set (i.e., AL=1, 2, 4, 8, 16).

For example, when '1' is selected from the AL candidate set (i.e., AL=1, 2, 4, 8, 16), a size of a mother code used in the PDCCH blind polar decoding procedure may be '128'.

For example, when '2' is selected from the AL candidate set (i.e., AL=1, 2, 4, 8, 16), the size of the mother code used in the PDCCH blind polar decoding procedure may be '256'.

For example, when any one of '4', '8', '16' is selected from the AL candidate set (i.e., AL=1, 2, 4, 8, 16), the size of the mother code used in the polar decoding procedure may be '512'.

For example, when it is decided that AL for the PDCCH blind polar decoding procedure is '8', the UE may perform a de-masking procedure for a CRC block based on the masking sequence of the first type.

For example, when it is decided that AL for the PDCCH blind polar decoding procedure is not '8' (i.e., any one of AL=1, 2, 4, 16), the UE may perform the de-masking procedure for the CRC block based on the masking sequence of the second type.

Although not shown in FIG. 16, since the UE according to the present embodiment decodes the PDCCH based on correct AL, a scheduled PDSCH (e.g., a length of the scheduled PDSCH) can be correctly decoded.

According to a present embodiment, in a block decoding procedure for a PDCCH, a mother code size with a correct size can be selected. In addition, since the number of masking sequences related to an aggregation level for the PDCCH can be decreased, an overhead of a wireless communication system can be decreased. Consequently, according to the present description, a wireless communication system with improved performance can be provided.

Figure 17:
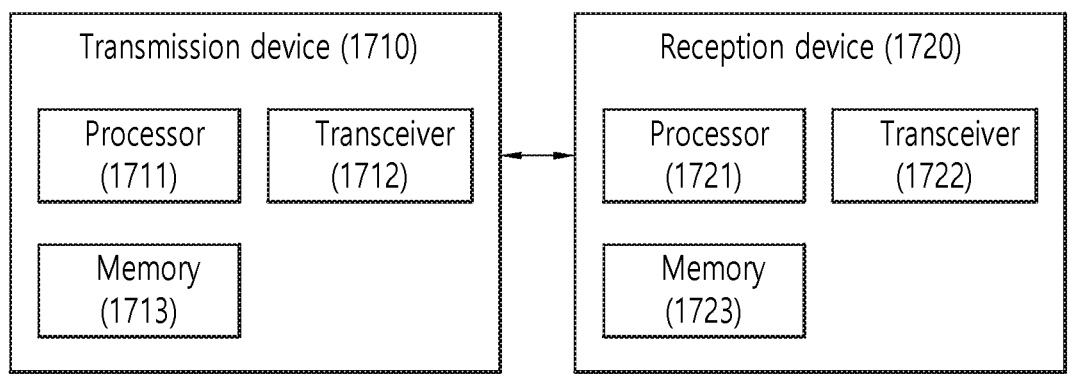
FIG. 17 is a block diagram showing components of a transmission device and a reception device according to a present embodiment.

FIG. 17 is a block diagram showing components of a transmission device and a reception device according to a present embodiment. Herein, each of the transmission device and the reception device may be a BS or a UE.

A transmission device 1710 and a reception device 1720 may respectively include transceivers 1712 and 1722 capable of transmitting or receiving radio signals carrying information and/or data, signals, messages, and the like, memories 1713 and 1723 storing various types of information related to communication in a wireless communication system, and processors 1711 and 1721 connected to components such as the transceivers 1712 and 1722 and the memories 1713 and 1723 and configured to control the memories 1713 and 1723 and/or the transceivers 1712 and 1722 such that the corresponding devices perform at least one of the aforementioned embodiments of the present description. Herein, a transmitter/receiver may be called a transceiver.

The memories 1713 and 1723 may store programs for processing and control of the processors 1711 and 1721 and temporarily store input/output information. The memories 1713 and 1723 may be used as buffers.

The processors 1711 and 1721 generally control overall operations of various modules in the transmission device and the reception device. Particularly, the processors 1711 and 1721 may execute various control functions for performing the present description. The processors 1711 and 1721 may also be called controllers, microcontrollers, microprocessors, microcomputers, and the like.

The processors 1711 and 1721 may be implemented by hardware, firmware, software or a combination thereof. When the present description is implemented using hardware, ASICs (application specific integrated circuits), DSPs (digital signal processors), DSPDs (digital signal processing devices), PLDs (programmable logic devices), FPGAs (field programmable gate arrays), or the like configured to perform the present description may be included in the processors 1711 and 1721.

Meanwhile, when the present description is implemented using firmware or software, firmware or software may be configured to include modules, procedures, functions, or the like which perform functions or operations of the present description, and the firmware or software configured to perform the present description may be included in the processors 1711 and 1721 or stored in the memories 1713 and 1723 and driven by the processors 1711 and 1721.

The processor 1711 of the transmission device 1710 may perform predetermined coding and modulation on a signal and/or data which will be transmitted to the outside and then transmit the coded and modulated signal or data to the transceiver 1712.

For example, the processor 1711 may generate a codeword by performing demultiplexing, channel coding, scrambling, and modulation on a data string to be transmitted. The codeword may include information equivalent to transport blocks that are data blocks provided by a MAC layer.

One transport block (TB) may be coded into one codeword. Each codeword may be transmitted to the reception device through one or more layers. For frequency up-conversion, the transceiver 1712 may include an oscillator. The transceiver 1712 may include one or a plurality of transmission antennas.

A signal processing procedure of the reception device 1720 may be reverse to the signal processing procedure of the transmission device 1710. The transceiver 1722 of the reception device 1720 may receive radio signals transmitted from the transmission device 1710 under the control of the processor 1721.

The transceiver 1722 may include one or a plurality of reception antennas. The transceiver 1722 may restore each signal received through the reception antenna to a baseband signal by performing frequency down-conversion.

The transceiver 1722 may include an oscillator for frequency down-conversion. The processor 1721 may restore data intended to be transmitted by the transmission device 1710 by performing decoding and demodulation on radio signals received through the reception antenna.

The transceivers 1712 and 1722 may include one or a plurality of antennas. The antennas may serve to transmit signals processed by the transceivers 1712 and 1722 to the outside or receive external radio signals and transmit the radio signals to the transceivers 1712 and 1722 according to an embodiment under the control of the processors 1711 and 1721.

The antennas may also be called antenna ports. Each antenna may correspond to one physical antenna or may be configured by a combination of two or more physical antennas. A signal transmitted from each antenna cannot be decomposed any more by the reception device 1720.

A reference signal (RS) transmitted in association with an antenna defines the antenna from a perspective of the reception device 1720 and enables the reception device 1720 to perform channel estimation for the antenna irrespective of whether a channel is a single radio channel from a physical antenna or a composite channel from a plurality of physical antenna elements including the antenna.

That is, an antenna may be defined such that a channel carrying symbols on the antenna can be derived from a channel carrying other symbols on the same antenna. A transceiver which supports a multi-input multi-output (MIMO) function for transmitting/receiving data using a plurality of antennas may be connected to two or more antennas.

Figure 18:
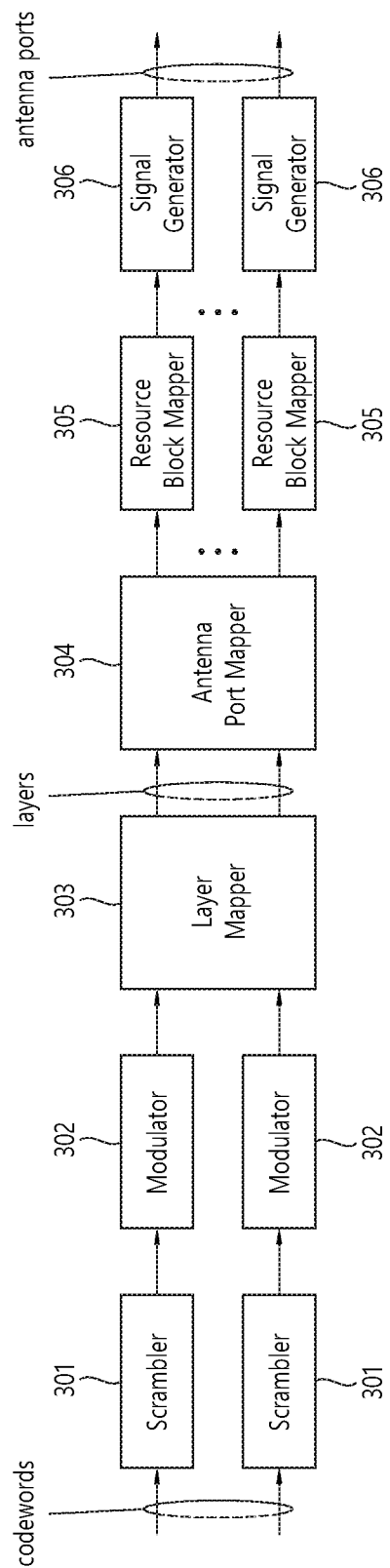
FIG. 18 shows an example of a structure of a signal processing module in a transmission device.

FIG. 18 shows an example of a structure of a signal processing module in a transmission device. Herein, signal processing based on the signal processing module included in the transmission device may be performed by the processor (e.g., 1711) of FIG. 17.

Referring to FIG. 18, a signal processing module in a UE or a BS may include a scrambler 301, a modulator 302, a layer mapper 303, an antenna port mapper 304, a resource block mapper 305 and a signal generator 306.

The transmission device (e.g., 1710) may transmit one or more codewords. Coded bits in each codeword are scrambled by the scrambler 301 and transmitted on a physical channel. A codeword may also be referred to as a data string and may be equivalent to a transport block that is a data block provided by a MAC layer.

The scrambled bits are modulated into complex-valued modulation symbols by the modulator 302. The modulator 302 may modulate the scrambled bits according to a modulation scheme and arrange the scrambled bits as complex-valued symbols representing positions on a signal constellation. The modulation scheme is not limited, and m-phase shift keying (m-PSK) or m-quadrature amplitude modulation (m-QAM) may be used to module the coded data. The modulator may also be referred to as a modulation mapper.

The complex-valued modulation symbols may be mapped to one or more transport layers by the layer mapper 303. The complex-valued modulation symbols on the layers may be mapped by the antenna port mapper 304 for transmission on antenna ports.

The resource block mapper 305 may map complex-valued modulation symbols for respective antenna ports to appropriate resource elements in a virtual resource block allocated for transmission. The resource block mapper may map the virtual resource block to a physical resource block according to an appropriate mapping scheme. The resource block mapper 305 may allocate the complex-valued modulation symbols for the respective antenna ports to appropriate subcarriers and multiplex the same according to a user.

The signal generator 306 may modulate the complex-valued modulation symbols for the respective antenna ports, that is, antenna-specific symbols according to a specific modulation scheme, for example, orthogonal frequency division multiplexing (OFDM) to generate a complex-valued time domain OFDM symbol signal.

The signal generator may perform inverse fast Fourier transform (IFFT) on the antenna-specific symbols, and a cyclic prefix (CP) may be inserted into time domain symbols on which IFFT has been performed. OFDM symbols are subjected to digital-to-analog conversion, frequency up-conversion, and the like and transmitted to a reception device through respective transmission antennas.

The signal generator may include an IFFT module, a CP insertion device, a digital-to-analog converter (DAC), a frequency uplink converter, and the like.

Figure 19:
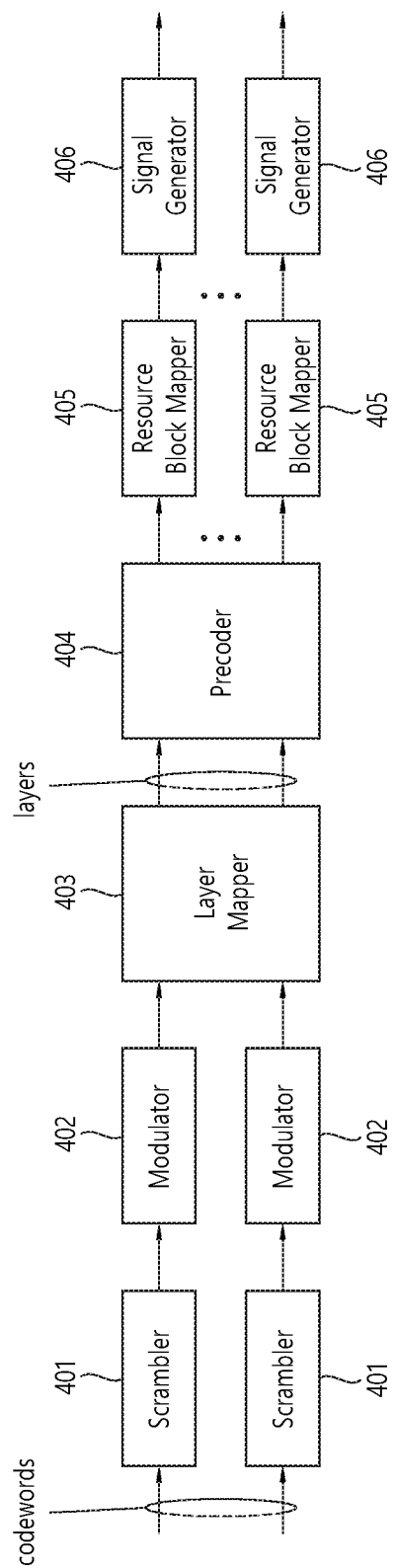
FIG. 19 shows another example of a structure of a signal processing module in a transmission device.

FIG. 19 shows another example of a structure of a signal processing module in a transmission device. Herein, signal processing based on the signal processing module included in the transmission device may be performed by the processor (e.g., 1711) of FIG. 17.

Referring to FIG. 19, a signal processing module in a UE or a BS may include a scrambler 401, a modulator 402, a layer mapper 403, a precoder 404, a resource block mapper 405, and a signal generator 406.

For a codeword, the transmission device (e.g., 1810) may scramble coded bits in the codeword through the scrambler 401 and then transmit the scrambled bits through a physical channel.

The scrambled bits are modulated into complex-valued modulation symbols by the modulator 402. The modulator may modulate the scrambled bits according to a predetermined modulation scheme and arrange the scrambled bits as complex-valued symbols representing positions on a signal constellation.

The modulation scheme is not limited, and pi/2-binary phase shift keying (pi/2-BPSK), m-phase shift keying (m-PSK) or m-quadrature amplitude modulation (m-QAM) may be used to modulate the coded data.

The complex-valued modulation symbols may be mapped to one or more transport layers by the layer mapper 403.

The complex-valued modulation symbols on the layers may be precoded by the precoder 404 for transmission through antenna ports. Herein, the precoder may perform precoding after performing transform precoding for the complex-valued modulation symbols.

Alternatively, the precoder may perform precoding without performing transform precoding. The precoder 404 may process the complex-valued modulation symbols according to MIMO using multiple transmission antennas to output antenna-specific symbols and distribute the antenna-specific symbols to the corresponding resource block mapper 405.

An output z of the precoder 404 may be obtained by multiplying output y of the layer mapper 403 by an N×M precoding matrix W. Herein, N is the number of antenna ports, and M is the number of layers.

The resource block mapper 405 maps complex-valued modulation symbols for respective antenna ports to appropriate resource elements in a virtual resource block allocated for transmission.

The resource block mapper 405 may allocate the complex-valued modulation symbols to appropriate subcarriers and multiplex the same according to a user.

The signal generator 406 may modulate the complex-valued modulation symbols according to a specific modulation scheme, for example, OFDM to generate a complex-valued time domain OFDM symbol signal.

The signal generator 406 may perform inverse fast Fourier transform (IFFT) on the antenna-specific symbols, and a cyclic prefix (CP) may be inserted into time domain symbols on which IFFT has been performed.

OFDM symbols are subjected to digital-to-analog conversion, frequency up-conversion, and the like and transmitted to a reception device through respective transmission antennas. The signal generator 406 may include an IFFT module, a CP insertion device, a digital-to-analog converter (DAC), a frequency uplink converter, and the like.

A signal processing procedure of the reception device (e.g. 1720) may be reverse to the signal processing procedure of the transmission device. Specifically, the processor (e.g., 1721) of the reception device (e.g., 1720) decodes and modulates a radio signal received from the outside through antenna port(s) of the transceiver (e.g., 1722).

The reception device (e.g., 1720) may include multiple reception antennas, and signals received through the reception antennas are restored into baseband signals and then restored into data strings intended to be transmitted by the transmission device 1810 through multiplexing and MIMO demodulation.

The reception device (e.g., 1720) may include a signal restoration device for restoring a received signal into a baseband signal, a multiplexer for combining and multiplexing received signals, and a channel demodulator for demodulating multiplexed signal strings into corresponding codewords.

The signal restoration device, the multiplexer, and the channel demodulator may be configured as an integrated module for executing functions thereof or as independent modules.

More specifically, the signal restoration device may include an analog-to-digital converter (ADC) for converting an analog signal into a digital signal, a CP remover for removing a CP from the digital signal, an FFT module for applying fast Fourier transform (FFT) to the CP-removed signal to output frequency domain symbols, and a resource element demapper/equalizer for restoring the frequency domain symbols into antenna-specific symbols.

The antenna-specific symbols are restored into a transport layer through the multiplexer, and the transport layer is restored into a codeword intended to be transmitted by the transmission device through the channel demodulator.

Figure 20:
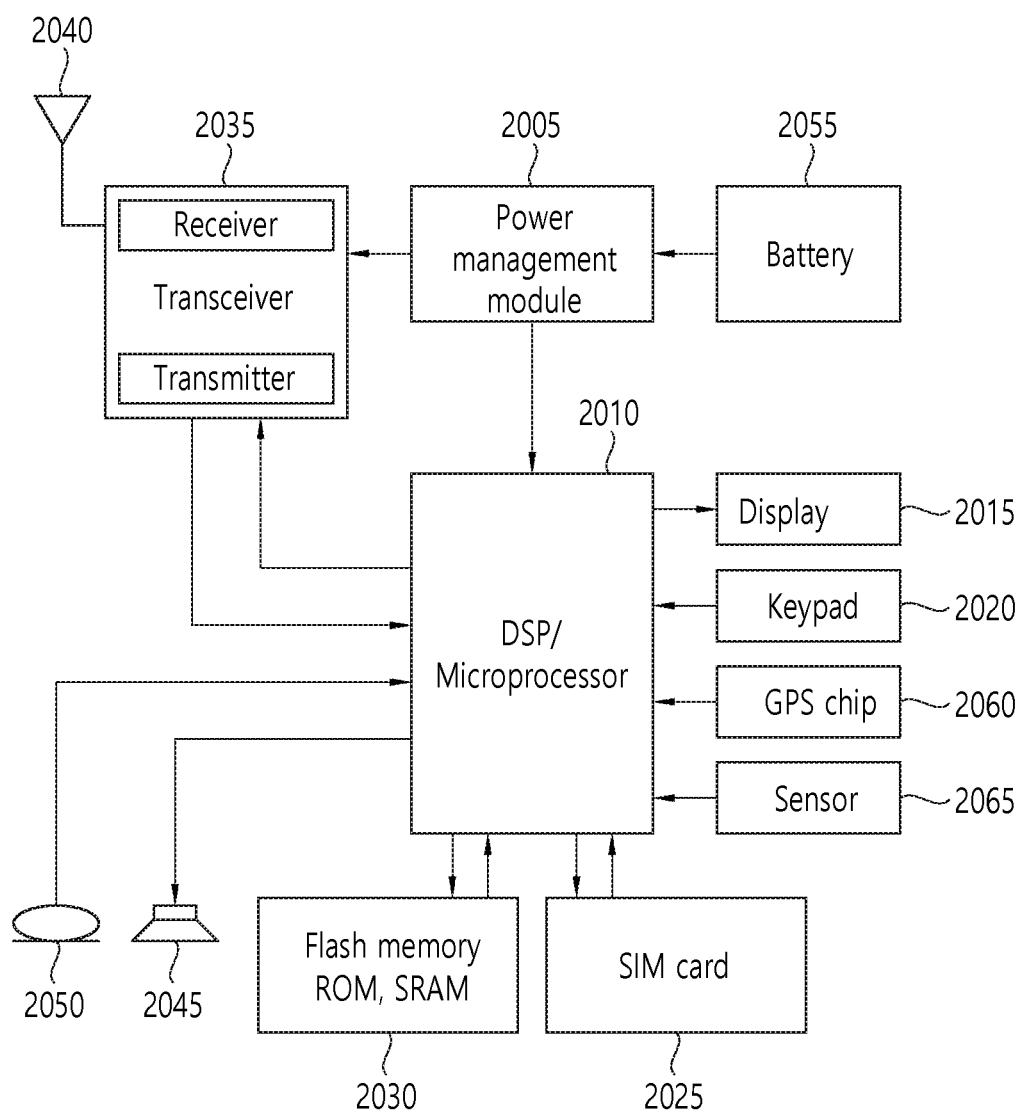
FIG. 20 shows an example of a wireless communication device according to an implementation example of the present description.

FIG. 20 shows an example of a wireless communication device according to an implementation example of the present description.

Referring to FIG. 20, the wireless communication device, for example, a UE may include at least one of a processor 2010 such as a digital signal processor (DSP) or a microprocessor, a transceiver 2035, a power management module 2005, an antenna 2040, a battery 2055, a display 2015, a keypad 2020, a global positioning system (GPS) chip 2060, a sensor 2065, a memory 2030, a subscriber identification module (SIM) card 2025, a speaker 2045, and a microphone 2050. A plurality of antennas and a plurality of processors may be provided.

The processor 2010 may implement functions, procedures, and methods described in the present description. The processor 2010 of FIG. 20 may be the processors 1711 and 1721 of FIG. 17.

The memory 2030 is connected to the processor 2010 and stores information related to operation of the processor. The memory may be located inside or outside the processor and connected to the processor through various techniques such as wired connection and wireless connection. The memory 2030 of FIG. 20 may be the memories 1713 and 1723 of FIG. 17.

A user may input various types of information such as telephone numbers using various techniques such as pressing buttons of the keypad 2020 and activating sound using the microphone 2050. The processor 2010 may receive user information, process the user information, and execute an appropriate function such as making a call using an input telephone number.

In some scenarios, data may be retrieved from the SIM card 2025 or the memory 2030 in order to execute an appropriate function. In some scenarios, the processor 2010 may display various types of information and data on the display 2015 for user convenience.

The transceiver 2035 is connected to the processor 2010 and transmit/receive radio signals such as radio frequency (RF) signals. The processor may control the transceiver in order to start communication or transmit radio signals including various types of information or data such as audio communication data.

The transceiver includes a transmitter and a receiver for transmitting and receiving radio signals. The antenna 2040 may facilitate transmission and reception of radio signals.

In some implementation examples, when the transceiver receives a radio signal, the transceiver may forward and convert the signal into a baseband frequency for processing by the processor. The processed signal may be processed through various techniques such as conversion into audible or readable information such that it is output through the speaker 2045. The transceiver of FIG. 20 may be the transceivers 1712 and 1722 of FIG. 17.

Although not shown in FIG. 20, the UE may additionally include various components such as a camera and a universal serial bus (USB) port. For example, the camera may be connected to the processor 2010.

FIG. 20 is only one implementation example for the UE, and the implementation example is not limited thereto. It is not necessary for the UE to include all components of FIG. 20. That is, some components, for example, the keypad 2020, the GSP chip 2060, the sensor 2065, and the SIM card may not be essential components, and in this case, they may not be included in the UE.

Although an embodiment has been described in detail in the present description, various modifications are possible without departing from the scope of the present description. Therefore, the scope of the present description should not be construed as being limited to the aforementioned embodiment, but should be defined by not only claims of the description described below but also equivalents to the claims.

What is claimed is:

1. A method performed by a communication device in a wireless communication system, the method comprising:
generating a cyclic redundancy check (CRC) block including a masking sequence, based on an aggregation level for a physical downlink control channel (PDCCH) and a mother code size for a polar code,
wherein the aggregation level is determined as one of 1, 2, 4, 8 and 16, and the mother code size is determined as one of 128, 256 and 512,
wherein the mother code size is determined based on the aggregation level;
generating a payload based on control information related to the PDCCH and the generated CRC block; and
performing a procedure of applying channel coding to the payload, based on the mother code size for the polar code,
wherein the masking sequence is selected as one of a first masking sequence and a second masking sequence based on the aggregation level and the mother code size,
wherein based on that the aggregation level is 8 and the mother code size is 512, the first masking sequence is selected for the masking sequence, and
wherein based on that the aggregation level is not 8 and the mother code size is one of 128, 256 and 512, the second masking sequence is selected for the masking sequence.

2. The method of claim 1, further comprising:
transmitting to a second communication device the payload to which the channel coding is applied.

3. The method of claim 1, wherein the aggregation level is related to the number of control channel elements (CCEs) for the PDCCH.

4. The method of claim 1, wherein based on that the aggregation level is 1, the mother code size is determined as 128,
wherein based on that the aggregation level is 2, the mother code size is determined as 256, and
wherein based on that the aggregation level is one of 4, 8 and 16, the mother code size is determined as 512.

5. A communication device comprising:
a transceiver transmitting and receiving a radio signal; and
a processor operatively coupled with the transceiver,
wherein the processor is configured to:
generate a cyclic redundancy check (CRC) block including a masking sequence, based on an aggregation level for a physical downlink control channel (PDCCH) and a mother code size for a polar code,
wherein the aggregation level is determined as one of 1, 2, 4, 8 and 16, and the mother code size is determined as one of 128, 256 and 512,
wherein the mother code size is determined based on the aggregation level;
generate a payload based on control information related to the PDCCH and the generated CRC block; and
perform a procedure of applying channel coding to the payload, based on the mother code size for the polar code,
wherein the masking sequence is selected as one of a first masking sequence and a second masking sequence based on the aggregation level and the mother code size,
wherein based on that the aggregation level is 8 and the mother code size is 512, the first masking sequence is selected for the masking sequence, and
wherein based on that the aggregation level is not 8 and the mother code size is one of 128, 256 and 512, the second masking sequence is selected for the masking sequence.

6. The communication device of claim 5, wherein the processor is further configured to:
transmit to a second communication device the payload to which the channel coding is applied.

7. The communication device of claim 5, wherein the aggregation level is related to the number of control channel elements (CCEs) for the PDCCH.

8. The communication device of claim 5, wherein based on that the aggregation level is 1, the mother code size is determined as 128,
wherein based on that the aggregation level is 2, the mother code size is determined as 256, and
wherein based on that the aggregation level is one of 4, 8 and 16, the mother code size is determined as 512.

* * * * *